(12) United States Patent
Lee et al.

(10) Patent No.: US 6,539,891 B1
(45) Date of Patent: Apr. 1, 2003

(54) CHEMICAL DEPOSITION REACTOR AND METHOD OF FORMING A THIN FILM USING THE SAME

(75) Inventors: Chun-Soo Lee, Taejon (KR); Won-Gu Kang, Taejon (KR); Kyu-Hong Lee, Taejon (KR); Kyoung-Soo Yi, Taejon (KR)

(73) Assignee: Genitech, Inc., Taejon (KR)

( * ) Notice: Subject to any disclaimer, the term of this patent is extended or adjusted under 35 U.S.C. 154(b) by 94 days.

(21) Appl. No.: 09/763,238

(22) PCT Filed: Jun. 19, 2000

(86) PCT No.: PCT/KR00/00642

§ 371 (c)(1),
(2), (4) Date: Feb. 14, 2001

(87) PCT Pub. No.: WO00/79576

PCT Pub. Date: Dec. 28, 2000

(30) Foreign Application Priority Data

Jun. 19, 1999 (KR) .............................................. 99-23078

(51) Int. Cl.[7] .............................................. C23C 16/00
(52) U.S. Cl. .................. 118/723 E; 118/715; 118/725; 118/723 ER
(58) Field of Search ................................ 118/715, 725, 118/723 E, 723 ER, 723 IR, 723 ME; 156/345.33

(56) References Cited

U.S. PATENT DOCUMENTS 5,711,811 A * 1/1998 Suntola et al. ............... 118/715
5,730,801 A * 3/1998 Tepman et al. ............... 118/715
6,002,108 A * 12/1999 Yoshioka ....................... 219/388
6,113,984 A * 9/2000 MacLeish et al. ............ 118/715

FOREIGN PATENT DOCUMENTS

| JP | 3048421 | 3/1991 |
| JP | 4320025 | 11/1992 |
| JP | 5047669 | 2/1993 |
| JP | 6291048 | 10/1994 |

* cited by examiner

Primary Examiner—Jeffrie R. Lund

(57) ABSTRACT

A chemical deposition reactor capable of switching rapidly from one process gas to another and method of forming a thin film using the same. The reactor of the present invention comprises: a reactor cover, having an inlet and an outlet, for keeping reactant gases from other part of the reactor where the pressure is lower than inside of the reactor; a gas flow control plate, fixed onto the reactor cover, for controlling the gas flow through inlet and outlet by the spacing between itself and the reactor cover; and a substrate supporting plate for confining a reaction cell with the reactor cover. The method of the present invention can be accomplished using the above reactor. In the method, process gases including a deposition gas, a reactant gas and a purge gas are sequentially and repeatedly supplied in the reactor to form a thin film on a substrate. A RF (Radio Frequency) plasma power is applied to a plasma electrode of the reactor synchronised with the supply of at least one among the process gases.

7 Claims, 5 Drawing Sheets

CHEMICAL DEPOSITION REACTOR AND METHOD OF FORMING A THIN FILM USING THE SAME

TECHNICAL FIELD

The present invention relates to a chemical deposition reactor used in a chemical deposition apparatus where reactant materials are supplied discontinuously or sequentially so that the reactant materials are not mixed in gas phases, and more particularly, to a chemical deposition reactor capable of switching rapidly from one process gas to another. The present invention also relates to a method of forming a thin film for use in semiconductor or flat display devices using the above reactor.

BACKGROUND ART

In the manufacture of semiconductor devices, efforts for improving apparatuses and processes have been continued in order to form a high quality thin film on a substrate. Recently, processes for forming a thin film using surface reaction of a semiconductor substrate were proposed. In the processes, thin films are formed by following three methods: Reactant materials are discontinuously supplied to the substrate; a type of thin film is formed by an atomic layer deposition; or reactant materials are sequentially supplied one by one to the substrate. According to the above methods, a film having uniform thickness can be obtained on the whole substrate regardless of the surface roughness of a substrate and impurities in the film can be reduced, resulting in a high quality film.

However, because reactors used in conventional chemical deposition apparatuses are designed to form a thin film using a process where reactant materials are simultaneously supplied into the reactors, the reactors are not optimal for the above three methods.

In a reactor where chemical deposition materials are supplied over a semiconductor substrate, reactant gases usually flow downward over the semiconductor substrate. In this case, a shower head is usually disposed between a reactant gas inlet and the substrate for the uniform flow of the reactant gas over the substrate. However, such a configuration makes the gas flow complex and requires a large size reactor, making rapid switching of reactant gases difficult. Accordingly, the conventional reactor employing a shower head is inadequate for the process where reactant gases are sequentially supplied to the reactor.

On the other hand, in the manufacture of semiconductor or flat display devices, high quality thin films are required. Such thin films may include metal films, insulator films such as metal oxide films, metal nitride films and etc., films for capacitors, interconnects and electrodes, inorganic films used for diffusion prevention, and etc.

These thin films may be formed by a physical vapor deposition, for example a sputtering process. The sputtering process, however, forms thin films with poor step coverage, so a chemical vapor deposition method is usually employed to improve the step coverage.

Figure 1A:
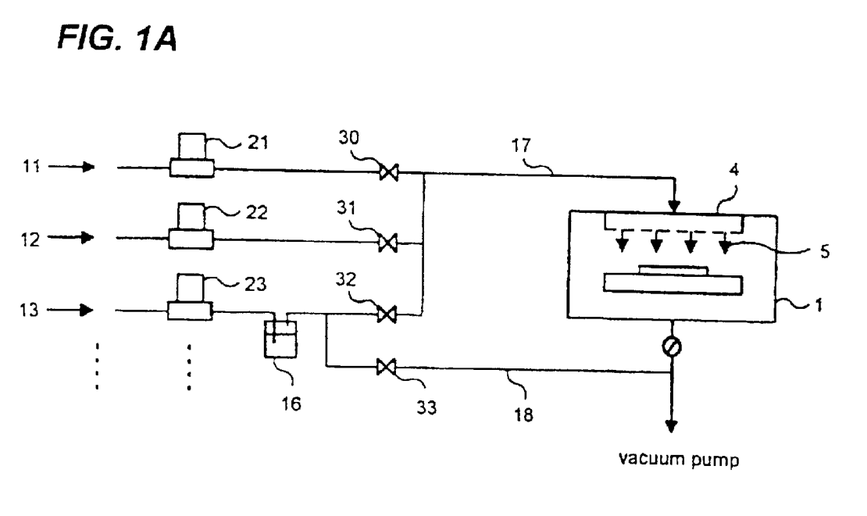
FIG. 1A and FIG. 1B are drawings showing an apparatus for a chemical vapor deposition and a method of supplying reactant gases employed in a film deposition process of the prior art.

One of the most common chemical vapor depositions of the prior art is carried out by an apparatus as shown in FIG. 1A. Referring to FIG. 1A, process gases or other reactants 11, 12, 13 are supplied into a reactor 1, respectively, through mass flow controllers 21, 22, 23 and valves 30, 31, 32. In this case, a shower head 4 is utilized to obtain uniform flow 5 of the process gases. When a source material is liquid or solid having low equilibrium vapor pressures, a vaporizer 16 is also employed that can heat the source material in a suitable temperature to vaporize and can supply the vaporized source material into the reactor 1 with the carrier gas 13. When the vaporizer is employed, the initial portion of the source material carried by the carrier gas 13 is exhausted via a bypass valve 33 and an outlet tube 18 due to the fluctuation of flow rate and source material concentration. Then, the bypass valve 33 is shut off and a valve 32 connected to a central supplying tube 17 is opened to supply the carrier gas into the reactor 1.

Figure 1B:
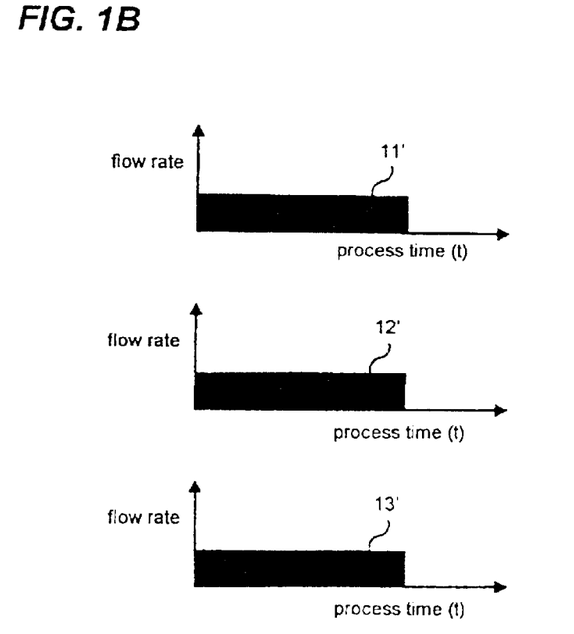

The chemical vapor deposition of the prior art performed in this apparatus has the following features: At first, all process gases 11, 12, 13 required for the deposition are supplied into the reactor 1 at the same time so that the film is continuously deposited during the process times 11', 12', 13' as in an example shown in FIG. 1B. At second, the shower head 4 is usually employed to make uniform flow of the process gases on the surface of a substrate.

This method has the following disadvantages: At first, since all process gases exist within the reactor at the same time, the process gases may react in gas phase thereby can deteriorate step coverage of the deposited film and/or produce particles which contaminate the reactor. At second, when using a metal-organic compound as a source material, it is difficult to deposit the film that does not contain carbon impurities. At third, in the case of depositing a multi-component film, all the reactant materials must react simultaneously while the supply of each reactant material is controlled separately by mass flow of the carrier gas, so it is very difficult to control the composition of the deposited film precisely.

To overcome the foregoing problems, a method is proposed in which the process gases are supplied separately as time-divisional pulses rather than supplied continuously.

Figure 2A:
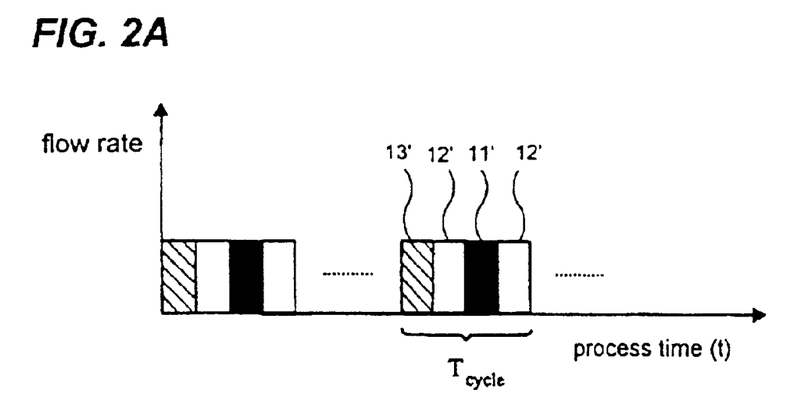
FIG. 2A to FIG. 2C are graphs showing a deposition process of the prior art which supply reactant gases in a time-divisional manner.

An example of supplying process gases in this deposition method is shown in FIG. 2A. Valves in a gas introducing part can be opened or closed so that the process gases can be supplied cyclically as time-divisional pulses into the reactor without being mixed with each other.

Referring to FIG. 2A, it can be seen that the process gases 11, 12, 13 in FIG. A are supplied in a cycle $T_{cycle}$ of 13', 12', 11' and 12'. A film can be deposited by repeating this cycle. In general, purge gas 12 is supplied between the supply pulses of the reactants 11 and 13 so that the remaining reactants are removed from the reactor before the next reactant is supplied.

Figure 2B:
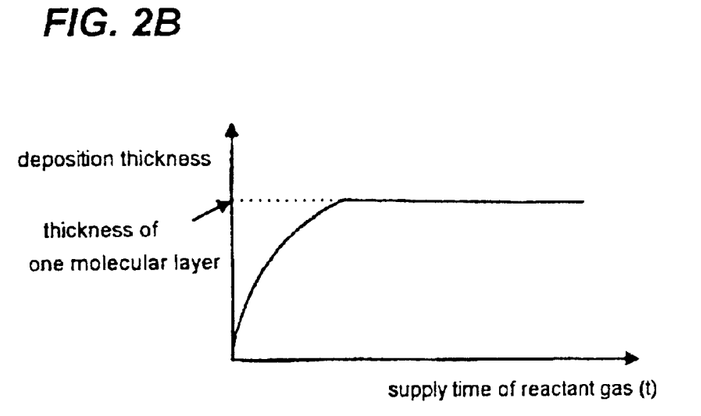

Hereinafter, a time-divisional deposition mechanism will be described. Chemical adsorption temperatures of the reactants onto the substrate are generally lower than thermal decomposition temperatures of the reactants. Therefore, when a deposition temperature is maintained higher than the chemical adsorption temperature of the reactant onto the substrate and lower than the thermal decomposition temperature of the reactant, the reactant supplied into the reactor only adsorbs chemically onto the surface of the substrate rather than decomposes. Then, the remaining reactant is exhausted out of the reactor by the purge gas supplied into the reactor. After that, another reactant is introduced into the reactor to react with the reactant adsorbed on the surface, and thus form a film. Because the reactant adsorbed on the substrate cannot form more than one molecular layer, film thickness formed in one supply cycle $T_{cycle}$ is constant regardless of amount or time of the supplied reactants. Therefore, as shown in FIG. 2B, the deposited film thickness is saturated as the supplying time elapses. In this case, the deposited film thickness is controlled only by the number of the repeated supply cycles.

Figure 2C:
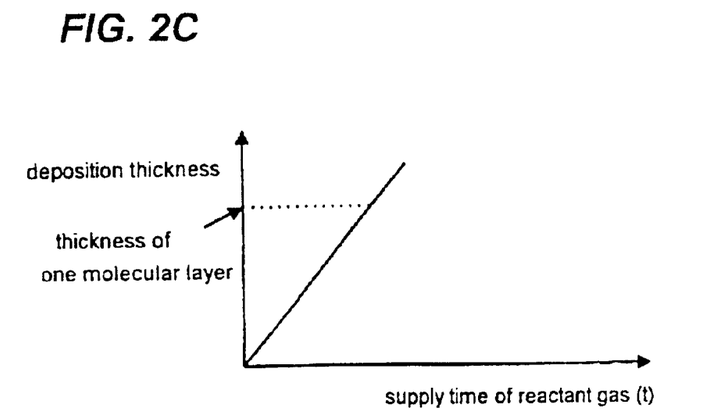

In the other hand, when the deposition process temperature is no lower than the thermal decomposition temperature of the reactants, the deposited film thickness is proportional to the supply time of the reactants in the supply cycle because the reactants introduced into the reactor decompose continuously to form films on the substrate. In this case, deposited film thickness according to the supply time of the reactants is shown in FIG. 2C.

However, the foregoing time-divisional deposition has problems as follows:

At first, the reactants used in the deposition process must react readily. Otherwise it is difficult to form a film by time-divisional deposition. In this case, a method is required that facilitate the chemical reaction even at low temperatures.

At second, the exhausting part of the apparatus may be contaminated with particles due to the reactions between the reactants. The gas-introducing part and the reactor may not be contaminated with the particles due to the reactions of the reactants because the reactants are separated by the purge gas. In the other hand, the exhausting part may be easily contaminated with particles because the reactants mix and react with each other at exhaust.

At third, it is required to supply inert purge gas between the reactant supply pulses to prevent gas-phase reactions in the gas-introducing part and the reactor, so the gas-supply cycle is complex, the time for a supply cycle is longer than absolutely necessary, and thus the deposition is slow.

A method is disclosed in the U.S. Pat. No. 5,916,365 in which a film is formed by repeating a gas-supply cycle, i.e., supplying first reactant gas into a reactor, exhausting remaining reactant gas within the reactor by a vacuum pump, supplying second reactant gas which is activated by passing through a radical generator using an RF power or other means, and exhausting remaining reactant gas by the vacuum pump.

The exhaust rate of the vacuum pump decreases as the pressure decreases, so it takes long time to exhaust the remaining reactant gases from the reactor with the vacuum pump. Therefore, in this method, it is difficult to have high growth rate of the film per unit time when it desired to exhaust the remaining reactant gases completely. When the exhausting time is too short, the reactant gases remain in the reactor so that the two reactant gases mix and react in gas phase. Furthermore, in the method of the U.S. Pat. No. 5,916,365, it is difficult to maintain stable plasma in the reactor because the supply and exhaust of the reactant gases cause wide pressure variation in the reactor.

DISCLOSURE OF INVENTION

Therefore, it is an object of the present invention to provide a reactor which can switch gas supply rapidly from one process gas to another and reduce the footprint of a chemical deposition apparatus into which reactant gases are discontinuously or sequentially supplied.

It is another object of the present invention to provide a reactor which makes the maintenance of a chemical deposition apparatus easier by minimizing areas exposed to reactant gases and reducing cleaning requirement.

It is a further object of the present invention to provide a reactor capable of preventing formation of a film on a circumference of semiconductor substrate.

It is a further object of the present invention to provide a reactor employing a plasma generator for cleaning the reactor and activating reactant gases.

It is a further object of the present invention to provide a method which can form a thin film effectively even if reactants do not react readily in a time-divisional source supply chemical vapor deposition method.

It is a further of the present invention to provide a method which can minimize supply time of a purge gas in a gas-supplying cycle to reduce cycle time in a time-divisional source supply chemical vapor deposition.

It is a further of the present invention to provide a method which can reduce particle contamination of the apparatus at the exhausting part of an apparatus for time-divisional source supply chemical vapor deposition.

In order to realize those foregoing objects related to the reactor, the present invention provides a reactor comprising: a reactor cover, having an inlet and an outlet for reactant gases, for keeping the reactant gases from other part of the reactor where the pressure is lower than inside of the reactor; a gas flow control plate having a projecting portion, with the projecting portion fixed onto the reactor cover, for controlling the gas flow through inlet and outlet by the spacing between itself and the reactor cover; and a substrate supporting plate contacting with the reactor cover in order to confine a reaction cell with the reactor cover.

The reactor of the present invention may further comprise a leakage-preventing gas passage, disposed along the contact portion between the reactor cover and the substrate supporting plate, for preventing leakage of reactant gases from the reaction cell.

Preferably, the opposing surfaces of the gas flow control plate and the reactor cover are substantially parallel with each other except for the projecting portion.

In addition, the reactor cover may further comprise protrusion means covering the circumference of the substrate so that the reactant gases may not contact with the circumference of the substrate, preventing the film formation thereon.

In order to activate reactant gases in the reaction cell, a plasma electrode is preferably disposed on the reactor cover or on the gas flow control plate In order to realize those foregoing objects related to the thin film forming method, the present invention provides a method used for a chemical vapor deposition in which source gases for forming a thin film are supplied into a reactor in a time-divisional manner so that they may not be mixed with each other in the reactor. In the method of the invention, the process gases are activated into plasma to facilitate the film formation, wherein plasma is generated synchronously with gas supply cycle.

For more clear description, process gases are classified as three kinds:

At first, the process gas that thermally decomposes to form a solid film is called a deposition gas. The deposition gas includes, for example, titanium-organic compound used for chemical vapor deposition for forming a TiN film.

At second, the process gas that does not decompose by itself or does not form a solid film upon self-decomposition, however, forms a solid film when reacts with a deposition gas is called a reactant gas. The reactant gas includes, for example, ammonia used in a chemical vapor deposition process for forming a nitride film, and oxygen gas used in a chemical vapor deposition process for forming a oxide film.

At third, the other inert process gas that is supplied between the supplies of the deposition gas and the reactant gas to separate the deposition gas and the reactant gas is called a purge gas. In general, helium, argon, nitrogen gas and etc. are used for a purge gas. Those gases contain the constituent element of the film may also used for a purge gases if they do not react with a deposition gas. In this case, the purge gas can be used for a reactant gas when activated by plasma.

Therefore, one of the most evident features of the present invention, in a chemical vapor deposition which forms a film on a substrate by supplying process gases which include a deposition gas, a reactant gas, and a purge gas into a reactor by repeating cycles of time-divisional gas supply, is to provide a method of generating plasma on the substrate synchronously with the supply cycles to activate at least one of the process gases. In this case, the plasma is generated synchronously with the supply cycle of the reactant gas.

Also, when a purge gas contains constituent elements of a film material and a reactant gas contains the other constituent elements of the film material and the purge gas does not substantially react with the reactant gas, plasma may be preferably generated synchronously during the supply cycle of the purge gas.

In the other hand, a film is deposited by alternate supply of only a deposition gas and a purge gas without any reactant gas into a reactor. In this case, the purge gas preferably contains constituent elements of a film material and does not react substantially react with the deposition gas if not activated; wherein plasma is preferably generated synchronously at least in part during the supply cycle of the purge gas to facilitate the reaction of the purge gas with the deposition gas.

The films deposited by above methods may be heat-treated after the deposition.

BEST MODE FOR CARRYING OUT THE INVENTION

Figure 3:
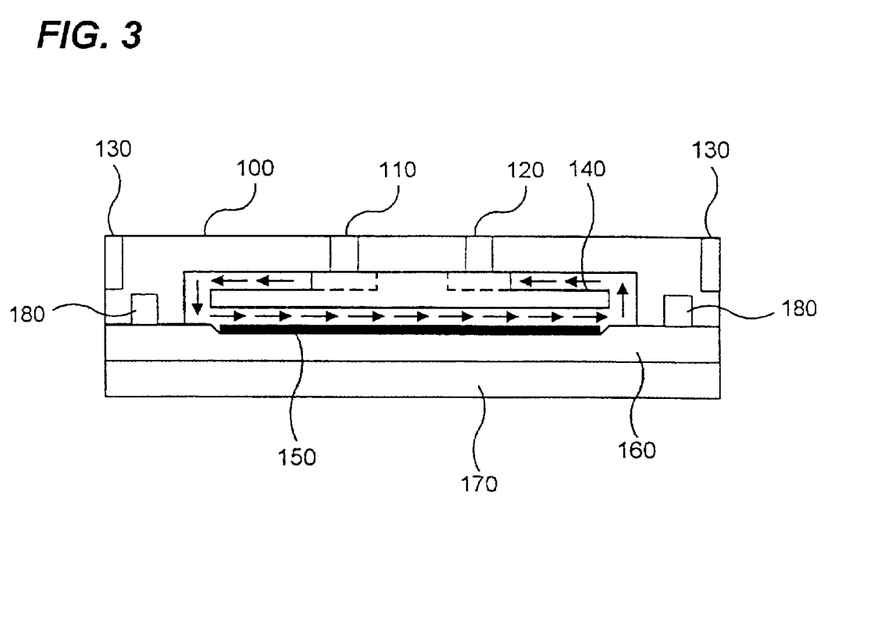
FIG. 3 is a cross sectional view of a chemical deposition reactor according to a first embodiment of the present invention.

Preferred embodiments of the present invention will be described hereinafter in reference to the appended drawings:

FIG. 3 is a cross sectional view of a chemical deposition reactor according to a first embodiment of the present invention. Referring to FIG. 3, a reactor cover 100 has an inlet 110 and an outlet 120 for process gases. The circumference of the reactor cover 100 is surrounded by a cover heater 130.

A gas flow control plate 140 having a projecting portion is fixed onto the lower surface of the reactor cover 100, controlling the gas flows (indicated by arrows) passed through the inlet 110 and outlet 120 by the spacing between the gas flow control plate 140 and the reactor cover 100. The spacing can be determined arbitrarily. On the other hand, a semiconductor substrate 150 on which a chemically deposited film to be formed is loaded on a substrate supporting plate 160. The temperature of the substrate 150 is controlled by a supporting plate heater 170 disposed under the substrate supporting plate 160. In this case, it is desirable to keep the reactant gases from leaking to other part of the reactor where the pressure is lower than inside of the reactor. On this purpose, an inert gas may be introduced along the contact portion between the reactor cover 100 and the substrate supporting plate 160. Accordingly, the reactor cover 100 has a groove along its circumference to be used as a leakage-preventing gas passage 180. The gas flow control plate 140 controls the flow of process gas introduced into the reactor in order to facilitate gas exhaust without undesirable residual gas within the reactor.

Figure 4:
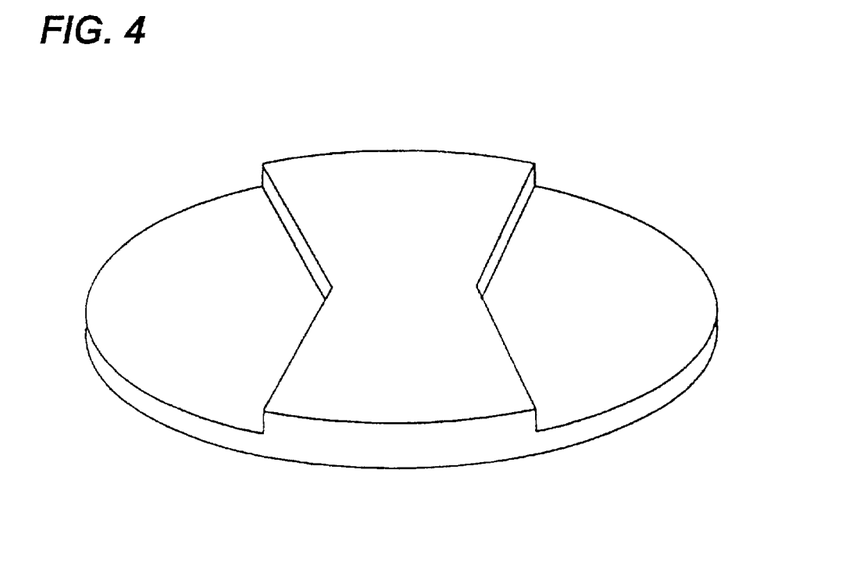
FIG. 4 shows a gas flow control plate used for the reactor according to the embodiment of the present invention.

FIG. 4 shows a gas flow control plate used for the reactor according to the embodiment of the present invention. According to the operation of such a gas flow control plate, the process gases introduced through a gas inlet are uniformly diffused in the reactor and then flow horizontally in a small space between the gas flow control plate and the semiconductor substrate, exiting via gas outlet. By using the gas flow control plate, process gases flow horizontally over the semiconductor substrate and gas supply from one process gas to another can be rapidly switched because the interior volume of the reactor is small.

Figure 5:
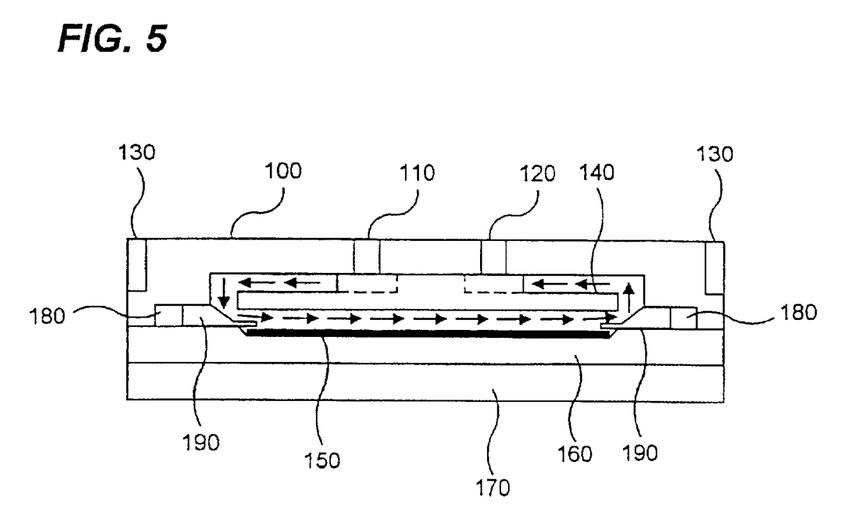
FIG. 5 is a cross sectional view of a chemical deposition reactor according to a second embodiment of the present invention.

FIG. 5 is a cross sectional view of a chemical deposition reactor according to a second embodiment of the present invention.

Hereinafter, same reference numbers designate the same elements of FIG. 3 and repeated description will be omitted for brevity.

According to the second embodiment of the present invention, the inner diameter of the reactor cover is larger than that of semiconductor substrate at their contact portion so that the reactor cover may cover the circumference of the semiconductor substrate. That is, a protrusion 190 disposed under the reactor cover prevents reactant gases from contacting with the circumference of the substrate, and no film is formed thereon.

Figure 6:
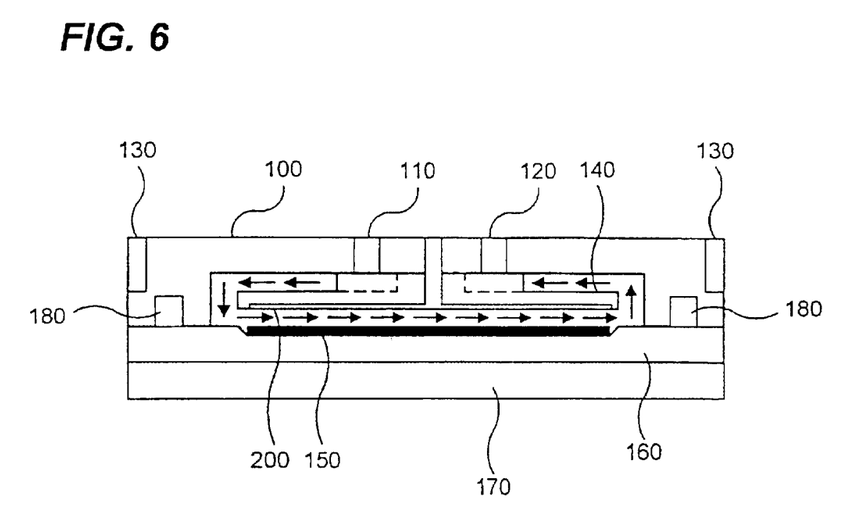
FIG. 6 is a cross sectional view of a chemical deposition reactor according to a third embodiment of the present invention.

FIG. 6 is a cross sectional view of a chemical deposition reactor according to a third embodiment of the present invention. Referring to FIG. 6, a plasma electrode 200, opposite to the semiconductor substrate 150, is installed in the gas flow control plate 140, generating plasmas to clean the inside of the reactor as well as to activate reactant gases to facilitate film formation.

Herein above the invention has been described in reference to the preferred embodiments, but various other modifications and variations will be apparent to those skilled in the art without departing from the scope and spirit of the present invention.

Therefore, the reactor cover and the gas flow control plate may be constructed as one body unlike the above embodiment where the gas flow control plate is attached to the reactor cover. In addition, the plasma electrode may be installed in the reactor cover.

Next, method of forming thin films for use in semiconductor or flat display devices by using the above reactor of the present invention will be described.

A first embodiment of the present invention method which is carried out according to FIG. 7A and FIG. 7B using the reactor of the present invention is as follows.

Figure 7A:
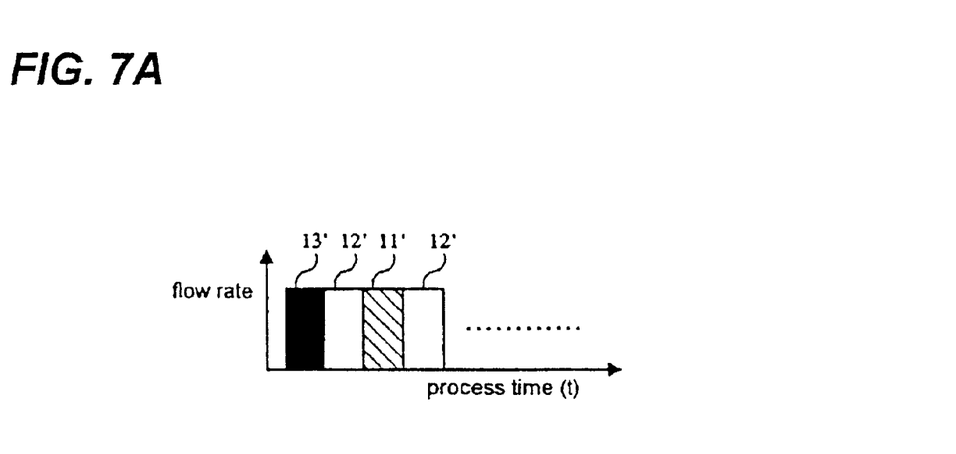
FIG. 7A and FIG. 7B are drawings showing methods of supplying reactant gases employed in a film deposition process of the present invention.
Figure 7B:
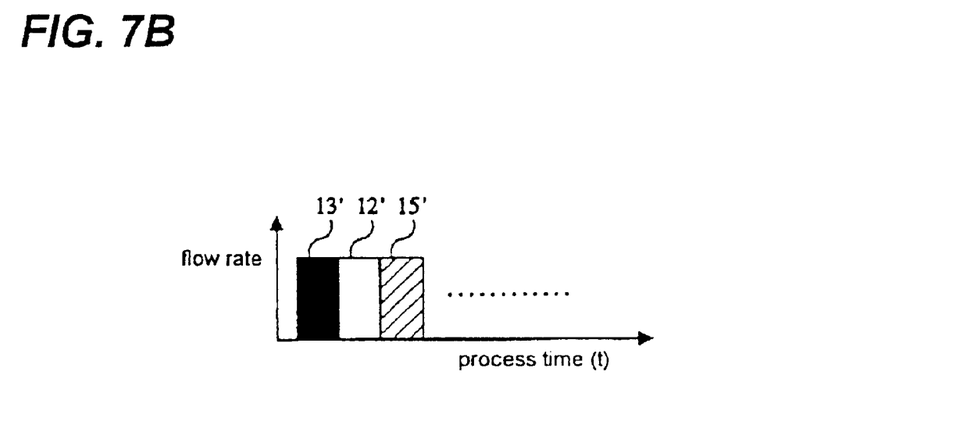

FIG. 7A is a graph showing that the process gases are supplied into the reactor in the supply cycle of deposition gas 13', purge gas 12', reactant gas 11' and purge gas 12'. At first, the deposition gas 13' is supplied into the reactor to be adsorbed to the substrate, and then the purge gas 12' is supplied to remove the remaining deposition gas from the reactor. Then, the reactant gas 11' is supplied into the reactor and at the same time the switch is closed to activate the reactant gas 11' with plasma, and thus facilitate chemical reaction with the deposition gas 13' adsorbed onto the substrate. When supply of the reactant gas is interrupted, the switch is opened to stop plasma generation and the purge gas 12' is introduced to remove the remaining reactant gas. In this method, the film can be formed even if the reaction between the deposition gas 13' and reactant gas 11' is weak because the reactant gas 11' is activated with plasma.

For example, when a metal-organic compound is used as chemical vapor deposition source, plasma-activated reactant gas may accelerate decomposition of the metal-organic compound and reduce carbon contamination of the film. Also, the activation energy applied to the film by the plasma may enhance crystallization, physical characteristics and electrical characteristics of the film.

As a detailed example of this process, a copper compound may be reduced to form a metallic copper film. In the temperature no higher than thermal decomposition temperature of the deposition gas, chemical reaction between the deposition gas and hydrogen gas, i.e. the reactant gas, does not take place and thus a metallic copper film cannot be formed. Therefore, a plasma electrode as described in the reactor of the present invention is installed, and plasma is generated as hydrogen gas is supplied into the reactor so that chemical reaction between the hydrogen gas and the copper source adsorbed to the substrate surface may be accelerated and thus form a metallic copper film. If the plasma generator is powered on while supplying the deposition gas, the copper source may decompose in gas phase so that particle contamination or poor step coverage may take place. Therefore, it is advantageous to synchronize RF power applied to the plasma generator with the supply cycle in such a manner that the plasma generator is powered off when the deposition gas is supplied and on only when the reactant gas is supplied.

According to second embodiment of the present invention, a gas that may undergo a very weak chemical reaction with the deposition gas, if any, may be employed as a reactant gas or a purge gas, in condition that this gas contains constituent elements of the film. A gas supplying method like this is shown in FIG. 7B. In this method, the deposition gas 13' is primarily adsorbed to the substrate, the remaining deposition gas is removed by the purge gas 12' which undergoes almost no chemical reaction with the deposition gas, if any, but may include constituent elements of the film, and then the plasma generator is powered on to transform the purge gas 12' into the reactant gas 15'. This reactant gas 15' can form a film by reacting with the deposition gas absorbed to the substrate. Then, after the plasma generator is powered off to stop the reaction, the deposition gas 13' can be supplied again into the reactor without any concerns about gaseous reaction. Therefore, during purge gas supply in the gas supply cycle, the plasma power supply is switched in the order of off, on, and off, thereby is equivalent of supplying a purge gas, a reactant gas and a purge gas, respectively. Also, the concentration of the activated species decreases very rapidly after the plasma power is turned off, so supply time of the purge gas can be minimized after the plasma power is off. In this kind of gas supply cycle, the gas-supply cycle consists of turn-on and turn-off of plasma generator instead of the supply of different gases. This method permits the time-divisional chemical vapor deposition with only two kinds of gases, so the gas supplying part of an apparatus can be simple and the cycle time of gas supply can be reduced. Furthermore, the deposition gas and the purge gas do not react with each other even if mixed, so there is no concerns about the particle contamination in the exhausting part.

Both of the foregoing two embodiments can be employed for the deposition of TiN film which is used for diffusion barrier as well as adhesive and anti-reflectory coatings.

Using the first embodiment, a TiN film may be formed by repeating the cycle of the supply of Ti-organic source for a deposition gas, ammonia gas for a reactant gas, and nitrogen gas for a purge gas, in which plasma is generated when the reactant gas is supplied.

When employing the second embodiment, Ti-organic source is used for a deposition gas, nitrogen gas for a purge gas, respectively, in which the plasma generator is powered on thereby causing the absorbed deposition gas to react with nitrogen gas after the deposition gas is removed by nitrogen gas. A TiN film may be formed by repeating the cycle including these steps. In this case, the nitrogen purge gas never reacts with the deposition gas when the plasma power supply is off so that particle is not generated at all.

As described above, in order to properly realize the method of the present invention in which the supplies of reactant gases should be rapidly switched, it will be appreciated that the reactor of the present invention, having the gas flow control plate, is very useful.

Industrial Applicability

As described above, according to the reactor of the present invention, deposition rate can be enhanced due to high speed switching of gas supplies in a chemical deposition process in which reactant gases are discontinuously or sequentially supplied to a substrate.

In addition, since the supply and exhaust of reactant gases are performed over a semiconductor substrate, the footprint of a chemical deposition apparatus in a semiconductor clean room can be reduced, reducing the maintenance fee of the apparatus.

In addition, a film is not formed on a circumference of semiconductor substrate, preventing particle contamination problem in consecutive processes.

Moreover, the reactor can be easily cleaned and reactant gases can be easily activated by plasma generation.

According to the method of the present invention, a film can be formed effectively even if reactants do not react readily in a time-divisional source supply chemical vapor deposition method.

In addition, supply time of a purge gas in a gas-supplying cycle can be minimized to reduce cycle time in a time-divisional source supply chemical vapor deposition, reducing the overall process time.

In addition, particle contamination of the apparatus at the exhausting part of an apparatus for time-divisional source supply chemical vapor deposition can be reduced.

What is claimed is:

1. A reactor of a chemical deposition apparatus, said reactor comprising:
   a reactor cover, having an inlet and an outlet for reactant gases;

a gas flow control plate having a projecting portion, with the projecting portion fixed onto the reactor cover, for controlling the gas flow through the inlet and the outlet by the spacing between the gas flow control plate and the reactor cover; and a substrate supporting plate in contact with the reactor cover to define a reaction cell with the reactor cover.

2. The reactor of claim 1, further comprising a leakage-preventing gas passage, disposed along the contact portion between the reactor cover and the substrate supporting plate, for preventing leakage of reactant gases from the reaction cell.

3. The reactor of claim 1, wherein the opposing surfaces of the gas flow control plate and the reactor cover are substantially parallel with each other.

4. The reactor of claim 1, wherein the reactor cover further comprises protrusion means covering the circumference of the substrate so that the reactant gases may not contact with the circumference of the substrate.

5. The reactor of claim 1, further comprising a cover heater for controlling the temperature of the reactor cover.

6. The reactor of claim 1, wherein a plasma electrode is disposed on the reactor cover in order to activate the reactant gases in the reaction cell.

7. The reactor of claim 1, wherein a plasma electrode is disposed on the gas flow control plate in order to activate the reactant gases in the reaction cell.

* * * * *

UNITED STATES PATENT AND TRADEMARK OFFICE
CERTIFICATE OF CORRECTION

PATENT NO. : 6,539,891 B1
DATED : April 1, 2003
INVENTOR(S) : Lee et al.

It is certified that error appears in the above-identified patent and that said Letters Patent is hereby corrected as shown below:

Column 2,
Line 19, "uniform flow of" should read -- uniform flow 5 of --.
Line 43, "in FIG. A are" should read -- in FIG. 1A are --.

Signed and Sealed this

Twenty-ninth Day of June, 2004

JON W. DUDAS
*Acting Director of the United States Patent and Trademark Office*